United States Patent
Kim

(10) Patent No.: US 12,108,616 B2
(45) Date of Patent: Oct. 1, 2024

(54) LIGHT EMITTING DIODE INCLUDING A QUANTUM DOT COMPLEX, METHOD OF MANUFACTURING THE SAME AND DISPLAY DEVICE INCLUDING THE SAME

(71) Applicant: Samsung Display Co., Ltd., Yongin-si (KR)

(72) Inventor: Yongil Kim, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 192 days.

(21) Appl. No.: 17/450,151

(22) Filed: Oct. 6, 2021

(65) Prior Publication Data

US 2022/0216442 A1 Jul. 7, 2022

(30) Foreign Application Priority Data

Jan. 7, 2021 (KR) .................. 10-2021-0001988

(51) Int. Cl.
*H10K 50/115* (2023.01)
*H10K 59/122* (2023.01)
(Continued)

(52) U.S. Cl.
CPC .......... *H10K 50/115* (2023.02); *H10K 71/00* (2023.02); *H10K 59/122* (2023.02); *H10K 59/38* (2023.02); *H10K 2102/361* (2023.02)

(58) Field of Classification Search
CPC .... H10K 50/115; H10K 71/00; H10K 59/122; H10K 59/38; H10K 2102/361;
(Continued)

(56) References Cited

U.S. PATENT DOCUMENTS

| | | | |
|---|---|---|---|
| 5,537,000 A | * | 7/1996 | Alivisatos .............. B82Y 30/00 313/499 |
| 7,651,674 B2 | * | 1/2010 | Jun ...................... C09K 11/565 977/773 |

(Continued)

FOREIGN PATENT DOCUMENTS

| KR | 10-2011-0109326 A | 10/2011 |
|---|---|---|
| KR | 10-1146410 B1 | 5/2012 |

(Continued)

OTHER PUBLICATIONS

Bhola N. Pal et al., 'Giant' CdSe/CdS Core/Shell Nanocrystal Quantum Dots as Efficient Electroluminescent Materials: Strong Influence of Shell Thickness on Light-Emitting Diode Performance, Nano Letters, Dec. 12, 2011, vol. 12, pp. 331-336, ACS Publications, American Chemical Society.

(Continued)

*Primary Examiner* — Caleb E Henry
(74) *Attorney, Agent, or Firm* — Lewis Roca Rothgerber Christie LLP

(57) ABSTRACT

A light emitting element (e.g., light emitting diode) includes a first electrode, a hole transport region on the first electrode, an emission layer on the hole transport region and containing a quantum dot complex, an electron transport region on the emission layer, and a second electrode on the electron transport region, wherein the quantum dot complex contains two or more quantum dots each including a core and a shell surrounding the core, the shell of one quantum dot is combined with a shell of at least one neighboring quantum dot, and the light emitting element (e.g., light emitting diode) may thus have improved luminous efficiency and service life.

14 Claims, 10 Drawing Sheets

(51) Int. Cl.
  *H10K 59/38* (2023.01)
  *H10K 71/00* (2023.01)
  *H10K 102/00* (2023.01)

(58) Field of Classification Search
  CPC ..... H10K 59/12; H01L 33/06; H01L 27/1214; H01L 27/156; H01L 33/005; H01L 33/14; H01L 33/24; H01L 33/26; H01L 33/58
  See application file for complete search history.

(56) References Cited

U.S. PATENT DOCUMENTS

| | | | | |
|---|---|---|---|---|
| 7,910,400 | B2 * | 3/2011 | Kwon | H10K 50/115 257/E21.007 |
| 9,385,194 | B2 | 7/2016 | Cho et al. | |
| 9,768,404 | B1 * | 9/2017 | Steckel | H10K 50/165 |
| 9,812,004 | B1 * | 11/2017 | Boshernitzan | G08C 17/02 |
| 9,831,706 | B2 * | 11/2017 | MacWilliams | H02J 7/32 |
| 9,874,693 | B2 * | 1/2018 | Baiocco | H01L 21/762 |
| 10,394,378 | B2 * | 8/2019 | Huang | G06F 3/0412 |
| 10,492,297 | B2 | 11/2019 | Chopra et al. | |
| 10,826,011 | B1 * | 11/2020 | Angioni | H10K 50/15 |
| 10,873,048 | B2 * | 12/2020 | Lee | H10K 50/15 |
| 2006/0039850 | A1 * | 2/2006 | Jun | C09K 11/08 423/561.1 |
| 2010/0140586 | A1 * | 6/2010 | Char | C09K 11/883 257/14 |
| 2012/0280345 | A1 * | 11/2012 | Zhu | G02B 6/1226 257/E31.127 |
| 2013/0009131 | A1 * | 1/2013 | Kazlas | H10K 50/00 257/13 |
| 2013/0037778 | A1 * | 2/2013 | Kazlas | C09K 11/883 257/E29.024 |
| 2014/0027816 | A1 * | 1/2014 | Cea | H01L 29/1054 257/E29.085 |
| 2014/0197507 | A1 * | 7/2014 | Assefa | H01L 31/0745 438/69 |
| 2015/0091093 | A1 * | 4/2015 | Bouche | H01L 27/092 257/369 |
| 2015/0268417 | A1 * | 9/2015 | Assefa | H01L 27/1461 385/14 |
| 2016/0027848 | A1 * | 1/2016 | Liu | H10K 50/8426 257/40 |
| 2016/0240590 | A1 * | 8/2016 | Liu | H10K 50/15 |
| 2016/0248029 | A1 * | 8/2016 | Liu | H10K 50/81 |
| 2017/0115823 | A1 * | 4/2017 | Huang | G06F 3/0421 |
| 2017/0221969 | A1 * | 8/2017 | Steckel | H10K 59/32 |
| 2018/0019371 | A1 * | 1/2018 | Steckel | H01L 27/1225 |
| 2018/0254421 | A1 * | 9/2018 | Kinge | H10K 71/00 |
| 2018/0309078 | A1 * | 10/2018 | Ju | H10K 50/115 |
| 2018/0351125 | A1 * | 12/2018 | He | H10K 71/00 |
| 2018/0366672 | A1 * | 12/2018 | Wang | C09K 11/08 |
| 2019/0163016 | A1 * | 5/2019 | Kim | H10K 50/00 |
| 2019/0296264 | A1 * | 9/2019 | Mathai | H10K 50/852 |
| 2020/0185462 | A1 * | 6/2020 | Lee | H10K 59/352 |
| 2020/0203650 | A1 * | 6/2020 | Kim | H10K 50/15 |
| 2020/0402686 | A1 * | 12/2020 | Pandey | H10N 60/83 |
| 2021/0028385 | A1 * | 1/2021 | Sakakibara | H10K 50/115 |
| 2021/0151629 | A1 * | 5/2021 | Boardman | H10K 50/115 |
| 2021/0408416 | A1 * | 12/2021 | Angioni | C09K 11/025 |
| 2021/0408417 | A1 * | 12/2021 | Angioni | H10K 50/16 |
| 2022/0013744 | A1 * | 1/2022 | Sakakibara | H05B 33/26 |

FOREIGN PATENT DOCUMENTS

| | | |
|---|---|---|
| KR | 10-1740429 B1 | 5/2017 |
| KR | 10-1874413 B1 | 7/2018 |
| KR | 10-2018-0097130 A | 8/2018 |
| KR | 10-2019-0061744 A | 6/2019 |
| KR | 10-2020-0041590 A | 4/2020 |

OTHER PUBLICATIONS

Nicholas Kirkwood et al., Finding and Fixing Traps in II-VI and III-V Colloidal Quantum Dots: The Importance of Z-Type Ligand Passivation, J. Am. Chem. Soc., Oct. 30, 2018, pp. 15712-15723, vol. 140, ACS Publications, American Chemical Society.

Yun Ku Jung et al., Thermal Decomposition Mechanism of Single-Molecule Precursors Forming Metal Sulfide Nanoparticles, J. Am. Chem. Soc. Articles, Dec. 14, 2009, pp. 178-184, vol. 132, No. 1, American Chemical Society.

* cited by examiner

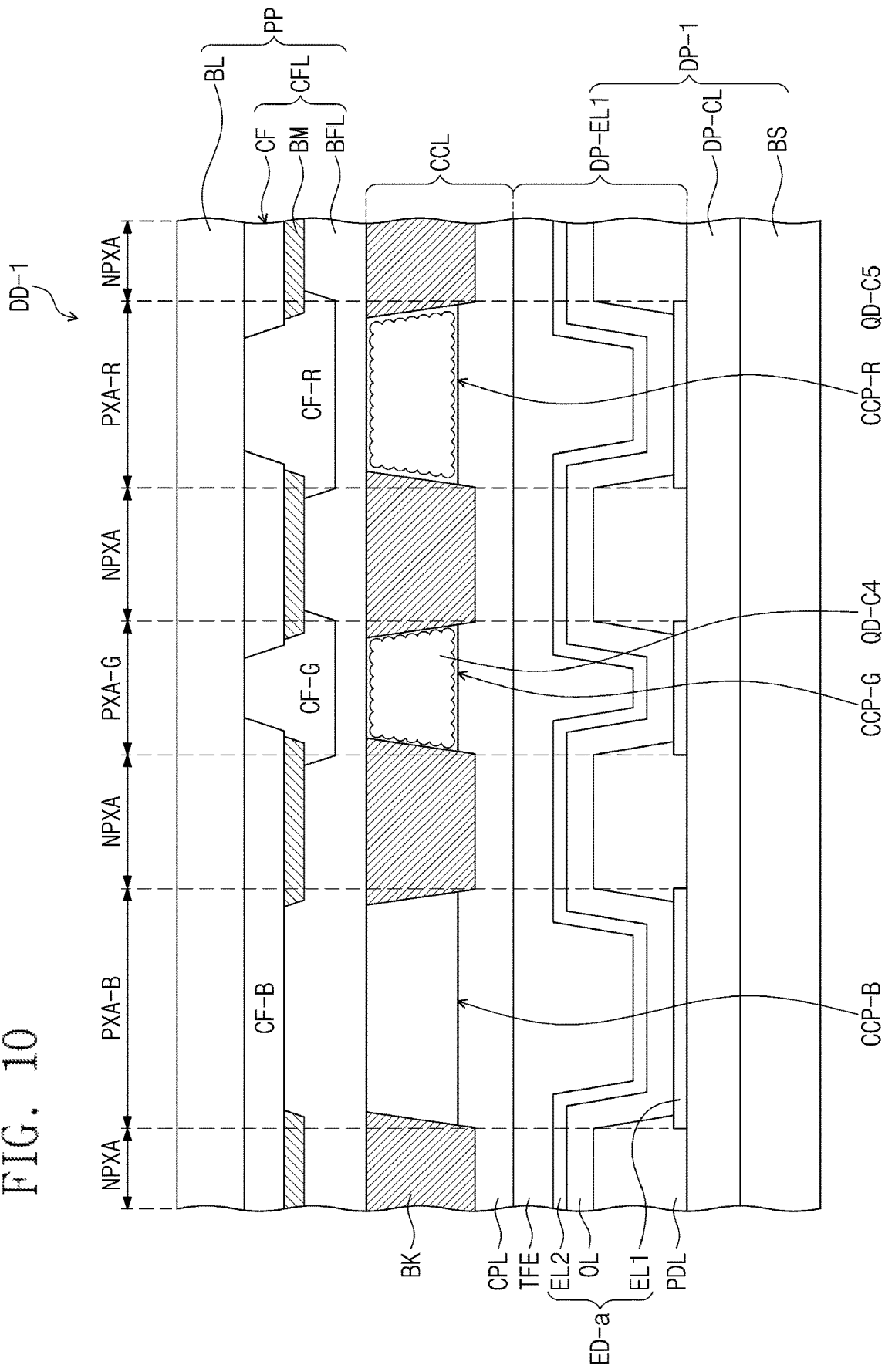

LIGHT EMITTING DIODE INCLUDING A QUANTUM DOT COMPLEX, METHOD OF MANUFACTURING THE SAME AND DISPLAY DEVICE INCLUDING THE SAME

CROSS-REFERENCE TO RELATED APPLICATION

This application claims priority to and the benefit of Korean Patent Application No. 10-2021-0001988, filed on Jan. 7, 2021, in the Korean Intellectual Property Office, the entire content of which is hereby incorporated by reference.

BACKGROUND

1. Field

The present disclosure herein relates to a light emitting element (e.g., light emitting diode), a method of manufacturing the same, and a display device including the same.

2. Description of Related Art

Various kinds (e.g., types) of display devices utilized for multimedia devices such as a television set, a mobile phone, a tablet computer, a navigation system, and/or a game console are being developed. In such display devices, a so-called self-luminescent display element is utilized, which accomplishes display by causing an organic compound-containing light emitting material to emit light.

In addition, the development of light emitting elements (e.g., light emitting diodes) utilizing quantum dots as a light emitting material is underway in an effort to enhance the color reproducibility of display devices, and there is a demand (e.g., need) for increasing the luminous efficiency and lifespan of the light emitting elements (e.g., light emitting diodes) utilizing quantum dots.

SUMMARY

One or more aspects according to embodiments of the present disclosure are directed toward a light emitting element (e.g., light emitting diode) and a display device having improved luminous efficiency and lifespan, including an emission layer containing a plurality of quantum dots in close distance to each other.

One or more aspects according to embodiments of the present disclosure are directed toward a method of manufacturing a light emitting element (e.g., light emitting diode) including forming a bond between shells (e.g., of neighboring quantum dots) through providing energy (e.g., the provision of specific energy) to improve film density.

According to an embodiment of the present disclosure, a light emitting element (e.g., light emitting diode) includes a first electrode, a hole transport region on the first electrode, an emission layer on the hole transport region and including a quantum dot complex, an electron transport region on the emission layer, and a second electrode on the electron transport region, wherein the quantum dot complex includes two or more quantum dots each including a core and a shell around (e.g., surrounding) the core, and of the two or more quantum dots, the shell of one quantum dot is combined with a shell of at least one neighboring quantum dot.

In an embodiment, the emission layer may further include low melting point particles, wherein the low melting point particles include a metal and/or an alloy having a melting point of 1300° C. or less.

In an embodiment, the low melting point particles may include at least one from among Al, Mg, Zn, Sn, Mn, Cu, and an alloy thereof.

In an embodiment, a weight ratio of the low melting point particles to the quantum dots may be about 1:200 to about 1:20.

In an embodiment, each of the low melting point particles may have a size of 1 μm or less.

In an embodiment, the shell may include at least one from among CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and AlSb.

In an embodiment, the hole transport region may include organic materials, and the electron transport region may include inorganic materials.

In an embodiment of the present disclosure, a display device includes a plurality of light emitting elements (e.g., light emitting diodes), and a light conversion layer on the plurality of light emitting elements (e.g., light emitting diodes) and including at least one light control unit including a quantum dot complex, wherein the quantum dot complex includes two or more quantum dots each including a core and a shell around the core, and of the two or more quantum dots, the shell of one quantum dot is combined with a shell of at least one neighboring quantum dot.

In an embodiment, the light emitting elements (e.g., light emitting diodes) may emit a first color light, and the light control unit may include a transmission unit to transmit the first color light, a first light control unit to convert the first color light into a second color light, and a second light control unit to convert the first color light into a third color light.

In an embodiment, the light control unit may further include low melting point particles, wherein the low melting point particles may include a metal and/or an alloy having a melting point of 800° C. or less.

In an embodiment, the display device may further include a color filter layer on the light emitting elements (e.g., light emitting diodes), wherein the color filter layer may include a first filter to transmit the first color light, a second filter to transmit the second color light, and a third filter to transmit the third color light.

In an embodiment of the present disclosure, a method of manufacturing a light emitting element (e.g., light emitting diode) includes providing a first electrode, forming a hole transport region on the first electrode, forming an emission layer on the hole transport region, forming an electron transport region on the emission layer, and forming a second electrode on the electron transport region, wherein the forming of the emission layer includes preparing a quantum dot composition including a plurality of quantum dots having a core and a shell around the core, providing the quantum dot composition to form a preliminary emission layer, and providing energy to the preliminary emission layer such that a temperature of the preliminary emission layer reaches about 30% to about 80% of a melting point of the shell.

In an embodiment, the quantum dot composition may further include low melting point particles.

In an embodiment, the preparing of the quantum dot composition may be performed by dispersing the plurality of quantum dots in an organic solvent.

In an embodiment, the method may further include binding a ligand to the plurality of quantum dots before the dispersing of the plurality of quantum dots in an organic solvent.

In an embodiment, in the providing of energy to the preliminary emission layer, the ligand may be dissociated from the plurality of quantum dots.

In an embodiment, the forming of the emission layer and the forming of the electron transport region on the emission layer may be performed through inkjet printing.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain principles of the present disclosure. In the drawings:

FIG. 10 is a cross-sectional view of a display device according to an embodiment.

DETAILED DESCRIPTION

Figure 1:
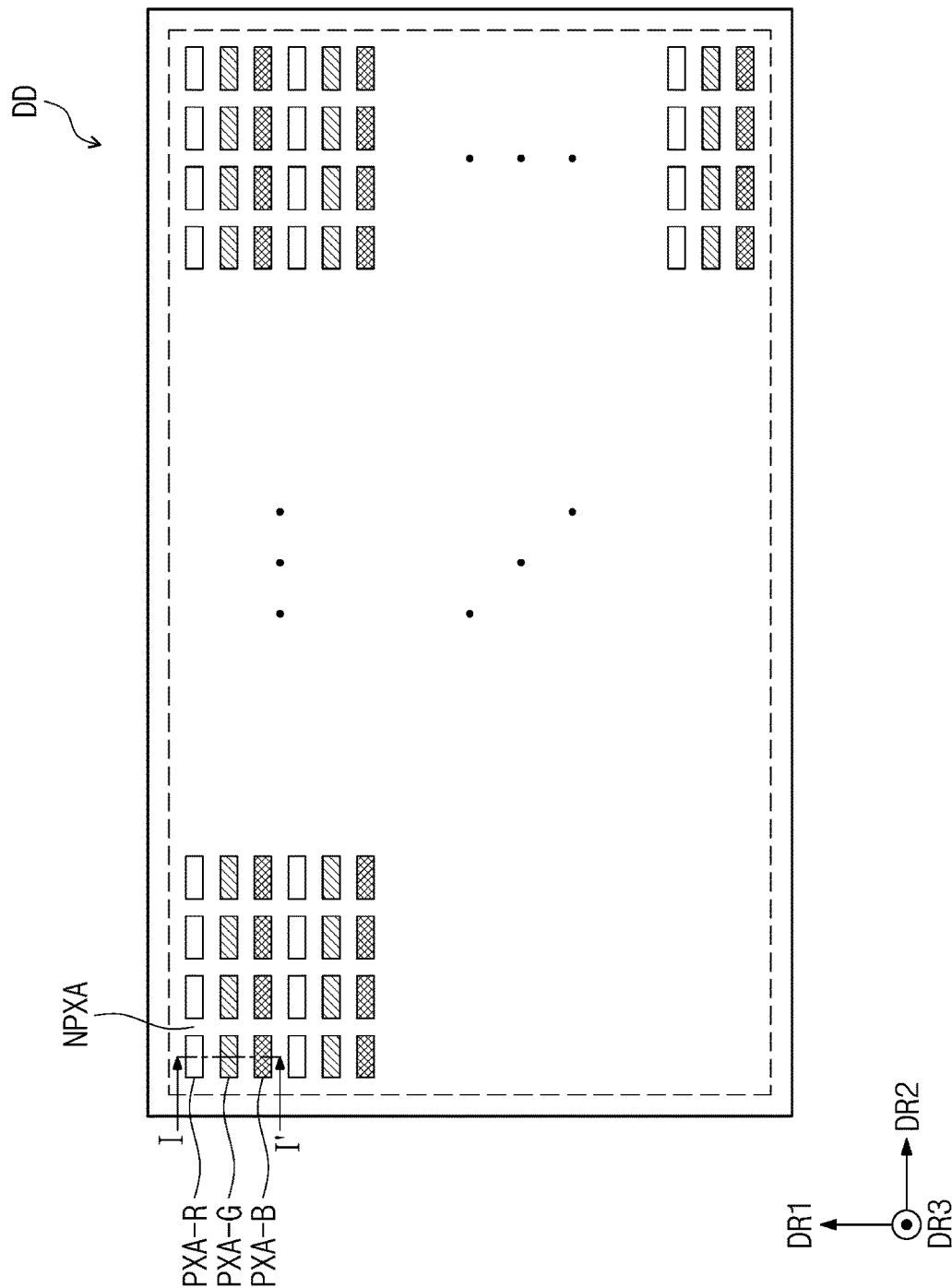
FIG. 1 is a plan view of a display device according to an embodiment of the present disclosure.

The present disclosure may be modified in many alternate forms, and thus specific embodiments will be illustrated in the drawings and described in more detail. It should be understood, however, that it is not intended to limit the present disclosure to the particular forms disclosed, but rather, is intended to cover all modifications, equivalents, and alternatives falling within the spirit and scope of the present disclosure.

In the present description, when an element (or a region, a layer, a portion, etc.) is referred to as being "on," "connected to," or "coupled to" another element, it refers to that the element may be directly disposed on/connected to/coupled to the other element, or that a third element may be disposed therebetween.

In the present description, the term "directly disposed" or "directly on" may indicate that there is no layer, film, region, plate and/or the like added between a portion of a layer, a film, a region, a plate and/or the like and other portions. For example, "directly disposed" or "directly on" may indicate no additional members such as an adhesive member exist between two layers or two members.

Like reference numerals refer to like elements. Also, in the drawings, the thickness, the ratio, and the dimensions of elements may be exaggerated for an effective description of technical contents.

The term "and/or," includes any and all combinations of one or more of the associated listed items.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. The terms of a singular form may include plural forms unless the context clearly indicates otherwise.

In addition, terms such as "below," "lower," "above," "upper," and/or the like are used to describe the relationship between the components shown in the drawings. The terms are used as a relative concept and are described with reference to the direction indicated in the drawings.

Unless otherwise defined, all terms (including technical and scientific terms) used herein have the same meaning as commonly understood by one of ordinary skill in the art to which the present disclosure pertains. It is also to be understood that terms defined in commonly used dictionaries should be interpreted as having meanings consistent with the meanings in the context of the related art, and should not be interpreted in an ideal or overly formal sense unless they are expressly defined herein.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

Hereinafter, a quantum dot composition, a light emitting element (e.g., light emitting diode), and a display device including the same according to an embodiment of the present disclosure will be described with reference to the accompanying drawings.

Figure 2:
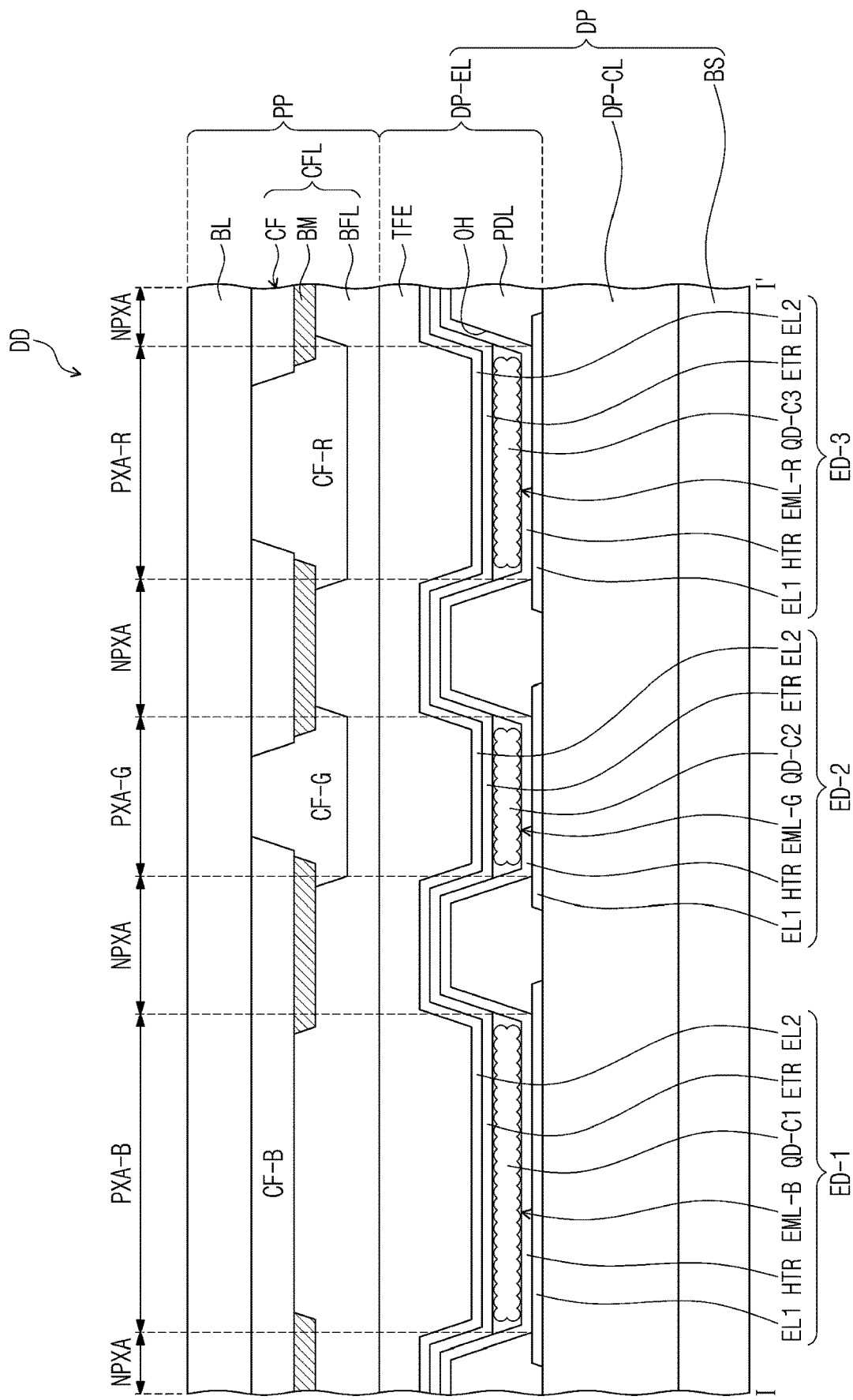
FIG. 2 is a cross-sectional view of a display device according to an embodiment of the present disclosure.

FIG. 1 is a plan view illustrating an embodiment of a display device DD. FIG. 2 is a cross-sectional view of a display device DD according to an embodiment. In particular, FIG. 2 is a cross-sectional view showing a portion corresponding to the line I-I' of FIG. 1.

The display device DD may include a display panel DP and an optical layer PP disposed on the display panel DP. The display panel DP may include light emitting elements (e.g., light emitting diodes) ED-1, ED-2, and ED-3. The display device DD may include a plurality of light emitting elements (e.g., light emitting diodes) ED-1, ED-2, and ED-3. The optical layer PP may be disposed on the display panel DP to control reflected light in the display panel DP due to external light. The optical layer PP may include, for example, a polarizing layer and/or a color filter layer. In one or more embodiments, unlike the one in the drawings, the optical layer PP may be omitted in the display device DD of an embodiment.

In the display device DD of an embodiment, the display panel DP may be a light emitting display panel. For example, the display panel DP may be a quantum dot light emitting display panel containing quantum dot light emitting elements (e.g., light emitting diodes). However, the present disclosure is not limited thereto.

The display panel DP may include a base substrate BS, a circuit layer DP-CL provided on the base substrate BS, and a display element layer DP-EL. The display element layer DP-EL may include a pixel defining film PDL, a plurality of light emitting elements (e.g., light emitting diodes) ED-1, ED-2, and ED-3 disposed between the pixel defining film PDL, and an encapsulation layer TFE disposed on the plurality of light emitting elements (e.g., light emitting diodes) ED-1, ED-2, and ED-3.

The base substrate BS may be a member providing a base surface on which the display element layer DP-EL is disposed. The base substrate BS may be a glass substrate, a metal substrate, a plastic substrate, etc. However, the present disclosure is not limited thereto, and the base substrate BS may be an inorganic layer, an organic layer, or a composite material (e.g., a complex material, including an inorganic material and an organic material) layer. The base substrate BS may be a flexible substrate that may be readily bent or folded.

In an embodiment, the circuit layer DP-CL may be disposed on the base substrate BS, and the circuit layer DP-CL may include a plurality of transistors. The transistors each may include a control electrode, an input electrode, and an output electrode. For example, the circuit layer DP-CL may include a switching transistor and a driving transistor for driving a plurality of light emitting elements (e.g., light emitting diodes) ED-1, ED-2 and ED-3 of the display element layer DP-EL.

The light emitting elements (e.g., light emitting diodes) ED-1, ED-2, and ED-3 each may have a structure of a light emitting element (e.g., light emitting diode) ED according to an embodiment shown in FIGS. 3 to 6, which will be described in more detail later. The light emitting elements (e.g., light emitting diodes) ED-1, ED-2, and ED-3 each may include a first electrode EL1, a hole transport region HTR, a corresponding one of emission layers EML-R, EML-G, and EML-B, an electron transport region ETR, and a second electrode EL2.

FIG. 2 illustrates an embodiment in which the emission layers EML-R, EML-G, and EML-B of the light emitting elements (e.g., light emitting diodes) ED-1, ED-2, and ED-3 are disposed in openings OH defined in the pixel defining film PDL, and the hole transport region HTR, the electron transport region ETR, and the second electrode EL2 are provided as a common layer throughout the light emitting elements (e.g., light emitting diodes) ED-1, ED-2, and ED-3. However, the present disclosure is not limited thereto, and unlike the one shown in FIG. 2, in an embodiment, the hole transport region HTR and the electron transport region ETR may be provided to be patterned inside the openings OH defined in the pixel defining film PDL. For example, in an embodiment, the hole transport region HTR, the emission layers EML-R, EML-G, and EML-B, and the electron transport region ETR, etc. of the light emitting elements (e.g., light emitting diodes) ED-1, ED-2, and ED-3 may be provided to be patterned through an inkjet printing method.

The pixel defining film PDL may be formed of a polymer resin. For example, the pixel defining film PDL may be formed from materials including a polyacrylate-based resin and/or a polyimide-based resin. In addition, the pixel defining film PDL may be formed by further including an inorganic material in addition to the polymer resin. In some embodiments, the pixel defining film PDL may be formed to further include a light absorbing material, or may be formed to further include a black pigment and/or a black dye. The pixel defining film PDL formed to further include a black pigment and/or a black dye may implement (e.g., produce) a black pixel defining film. When forming the pixel defining film PDL, carbon black may be utilized as a black pigment and/or a black dye, but the present disclosure is not limited thereto.

In some embodiments, the pixel defining film PDL may be formed of an inorganic material. For example, the pixel defining film PDL may be formed from materials including silicon nitride (SiNx), silicon oxide (SiOx), silicon oxide (SiOxNy), etc. The pixel defining film PDL may define light emitting areas PXA-B, PXA-G, and PXA-R. The light emitting areas PXA-B, PXA-G, and PXA-R, and a non-light emitting area NPXA may be separated by the pixel defining film PDL.

An encapsulation layer TFE may cover the light emitting elements (e.g., light emitting diodes) ED-1, ED-2 and ED-3. The encapsulation layer TFE may seal the display element layer DP-EL. The encapsulation layer TFE may be a thin film encapsulation layer. The encapsulation layer TFE may be a single layer or a laminated layer of a plurality of layers. The encapsulation layer TFE includes at least one insulating layer. The encapsulation layer TFE according to an embodiment may include at least one inorganic film (hereinafter, an encapsulation inorganic film). In some embodiments, the encapsulation layer TFE according to an embodiment may include at least one organic film (hereinafter, an encapsulation organic film) and at least one encapsulation inorganic film.

The encapsulation inorganic film protects the display element layer DP-EL from moisture/oxygen, and the encapsulation organic film protects the display element layer DP-EL from foreign substances such as dust particles. The encapsulation inorganic film may include silicon nitride, silicon oxy nitride, silicon oxide, titanium oxide, aluminum oxide, etc., but the present disclosure is not particularly limited thereto. The encapsulation organic layer may include an acrylic-based compound, an epoxy-based compound, etc. The encapsulation organic layer may include a photopolymerizable organic material, and is not particularly limited.

The encapsulation layer TFE may be disposed on the second electrode EL2, and may be disposed to fill the opening OH. In some embodiments, a capping layer CPL may be further disposed between the second electrode EL2 and the encapsulation layer TFE. The capping layer CPL may include a multilayer or a single layer.

Referring to FIGS. 1 and 2, the display device DD may include a non-light emitting area NPXA and light emitting areas PXA-B, PXA-G, and PXA-R. The light emitting areas PXA-B, PXA-G, and PXA-R each may be an area emitting light generated from each of the light emitting elements (e.g., light emitting diodes) ED-1, ED-2, and ED-3. The light emitting areas PXA-B, PXA-G, and PXA-R may be spaced apart from one another on a plane (e.g., in a plan view).

Each of the light emitting areas PXA-B, PXA-G and PXA-R may be an area separated by the pixel defining film PDL. The non-light emitting areas NPXA may be areas between neighboring light emitting areas PXA-B, PXA-G and PXA-R, and may correspond to the pixel defining film PDL. Meanwhile, in the present description, each of the light emitting areas PXA-B, PXA-G and PXA-R may correspond to a pixel. The pixel defining film PDL may separate the light emitting elements (e.g., light emitting diodes) ED-1, ED-2 and ED-3. The emission layers EML-R, EML-G, and EML-B of the light emitting elements (e.g., light emitting diodes) ED-1, ED-2 and ED-3 may be disposed and separated in an opening OH defined in the pixel defining film PDL.

The light emitting areas PXA-B, PXA-G, and PXA-R may be divided into a plurality of groups according to colors of light generated from the light emitting elements (e.g., light emitting diodes) ED-1, ED-2, and ED-3. In the display device DD of an embodiment illustrated in FIGS. 1 and 2, three light emitting areas PXA-B, PXA-G, and PXA-R, which emit red light, green light, and blue light, respectively, are illustrated as an example. For example, the display device DD of an embodiment may include a blue light emitting area PXA-B, a green light emitting area PXA-G, and a red light emitting area PXA-R, which are distinct from one another.

In the display device DD according to an embodiment, the light emitting elements (e.g., light emitting diodes) ED-1, ED-2, and ED-3 may emit light having different wavelength ranges. For example, in an embodiment, the display device DD may include a first light emitting element (e.g., light emitting diode) ED-1 emitting blue light, a second light emitting element (e.g., light emitting diode) ED-2 emitting green light, and a third light emitting element (e.g., light emitting diode) ED-3 emitting red light. That is, the blue light emitting area PXA-B, the green light emitting area PXA-G, and the red light emitting area PXA-R of the display device DD may correspond to the first light emitting element (e.g., light emitting diode) ED-1, the second light emitting element (e.g., light emitting diode) ED-2, and the third light emitting element (e.g., light emitting diode) ED-3, respectively.

However, the present disclosure is not limited thereto, and the first to third light emitting elements (e.g., light emitting diodes) ED-1, ED-2 and ED-3 may emit light in the same wavelength range or emit light in at least one different wavelength range. For example, the first to third light emitting elements (e.g., light emitting diodes) ED-1, ED-2, and ED-3 may all emit blue light.

A first emission layer EML-B of the first light emitting element (e.g., light emitting diode) ED-1 may include a first quantum dot complex QD-C1. The first quantum dot complex QD-C1 may be one that first quantum dots are combined with neighboring first quantum dots (e.g., neighboring first quantum dots are combined with one another). The first quantum dot complex QD-C1 may emit blue light, which is a first light.

A second light emitting layer EML-G of the second light emitting element (e.g., light emitting diode) ED-2 and a third light emitting layer EML-R of the third light emitting element (e.g., light emitting diode) ED-3 may include a second quantum dot complex QD-C2 and a third quantum dot complex QD-C3, respectively. The second quantum dot complex QD-C2 may be one that second quantum dots are combined with neighboring second quantum dots (e.g., neighboring second quantum dots are combined with one another). The third quantum dot complex QD-C3 may be one that third quantum dots are combined with neighboring third quantum dots (e.g., neighboring third quantum dots are combined with one another). The second quantum dot complex QD-C2 and the third quantum dot complex QD-C3 may emit green light, which is a second light, and red light, which is a third light, respectively.

In the present description, the quantum dot complexes QD-C1, QD-C2, and QD-C3 may each refer to a form in which a shell of a quantum dot is combined with a shell of a neighboring quantum dot. The quantum dot complex QD-C will be described in more detail with reference to FIGS. 4A and 4B.

In an embodiment, the first to third quantum dots of the first to third quantum dot complexes QD-C1, QD-C2, and QD-C3 included in the light emitting elements (e.g., light emitting diodes) ED-1, ED-2, and ED-3 respectively may be formed of different core materials. In another embodiment, the first to third quantum dots of the first to third quantum dot complexes QD-C1, QD-C2, and QD-C3 may be formed of the same core material, or two quantum dots selected from the first to third quantum dots may be formed of the same core material, and the rest (e.g., a remainder thereof) may be formed of different core materials.

In an embodiment, the first to third quantum dots of the first to third quantum dot complexes QD-C1, QD-C2, and QD-C3 may have different diameters. For example, the first quantum dot utilized in the first light emitting element (e.g., light emitting diode) ED-1 emitting light in relatively shorter wavelength ranges may have a relatively smaller average diameter than the second quantum dot of the second light emitting element (e.g., light emitting diode) ED-2 and the third quantum dot of the third light emitting element (e.g., light emitting diode) ED-3, each emitting light in relatively longer wavelength ranges. However, the present disclosure is not limited thereto, and the first to third quantum dots may be similar in size. In addition, the average diameter of two quantum dots selected from the first to third quantum dots may be similar, and the rest (e.g., a remainder thereof) may be different.

The light emitting areas PXA-B, PXA-G, and PXA-R in the display device DD according to an embodiment may be arranged in the form of a stripe. Referring to FIG. 1, a plurality of red light emitting areas PXA-R may be arranged with each other along a second directional axis DR2, a plurality of green light emitting areas PXA-G R may be arranged with each other along the second directional axis DR2, and a plurality of blue light emitting areas PXA-B R may be arranged with each other along the second directional axis DR2. In addition, a red light emitting area PXA-R, a green light emitting area PXA-G, and a blue light emitting area PXA-B may be alternately arranged in turn along a first directional axis DR1.

FIGS. 1 and 2 illustrate that the light emitting areas PXA-B, PXA-G, and PXA-R are all similar in size, but the present disclosure is not limited thereto, and the light emitting areas PXA-R, PXA-G and PXA-B may be different in size from each other according to the wavelength range of emitted light. Here, the areas of the light emitting areas PXA-B, PXA-G, and PXA-R may refer to an area when viewed on a plane defined by the first directional axis DR1 and the second directional axis DR2 (e.g., in a plan view).

Meanwhile, the arrangement of the light emitting areas PXA-B, PXA-G, and PXA-R is not limited to the one illustrated in FIG. 1, and the order that the red light emitting area PXA-R, the green light emitting area PXA-G, and the blue light emitting area PXA-B may be arranged may have various suitable combination according to display quality characteristics required for the display device DD. For example, the light emitting areas PXA-B, PXA-G, and PXA-R may be arranged in the form of a Pentile™ or a diamond shape.

In addition, an area of each of the light emitting areas PXA-B, PXA-G, and PXA-R may be different in size from one another. For example, in an embodiment, the green light emitting area PXA-G may be smaller than the blue light emitting area PXA-B in size, but the present disclosure is not limited thereto.

Referring to FIG. 2, the display device DD of an embodiment may further include a light control layer PP. The light control layer PP may block external light incident to the display panel DP from the outside of the display device DD. The light control layer PP may block some of the external light. The light control layer PP may perform a reflection preventing or reducing function to minimize or reduce reflection of (e.g., due to) external light.

In an embodiment, the light control layer PP may include a color filter layer CFL. That is, the display device DD of an embodiment may further include the color filter layer CFL disposed on the light emitting elements (e.g., light emitting diodes) ED-1, ED-2, and ED-3 of the display panel DP.

In the display device DD of an embodiment, the light control layer PP may include a base layer BL and the color filter layer CFL.

The base layer BL may be a member providing a base surface on which the color filter layer CFL is disposed. The base layer BL may be a glass substrate, a metal substrate, a plastic substrate, etc. However, the present disclosure is not limited thereto, and the base layer BL may be an inorganic layer, an organic layer, or a composite material layer.

The color filter layer CFL may include a light blocking unit BM and a color filter CF. The color filter CF may include a plurality of filters CF-B, CF-G, and CF-R. That is, the color filter layer CFL may include a first filter CF-B transmitting a first color light, a second filter CF-G transmitting a second color light, and a third filter CF-R transmitting a third color light. For example, the first filter CF-B may be a blue filter, the second filter CF-G may be a green filter, and the third filter CF-R may be a red filter.

Each of the filters CF-B, CF-G, and CF-R may include a polymer photosensitive resin and a pigment and/or a dye. The first filter CF-B may include a blue pigment and/or a blue dye, the second filter CF-G may include a green pigment and/or a green dye, and the third filter CF-R may include a red pigment and/or a red dye.

Meanwhile, the present disclosure is not limited thereto, and the first filter CF-B may not include a pigment or a dye. The first filter CF-B may include a polymer photosensitive resin, but may not include a pigment or a dye. In some embodiments, the first filter CF-B may be transparent. The first filter CF-B may be formed of a transparent photosensitive resin.

The light blocking unit BM may be a black matrix. The light blocking unit BM may be formed to include an organic light blocking material and/or an inorganic light blocking material, both including a black pigment and/or a black dye. The light blocking unit BM may prevent or reduce light leakage, and separate boundaries between the adjacent filters CF-B, CF-G, and CF-R.

The color filter layer CFL may further include a buffer layer BFL. For example, the buffer layer BFL may be a protection layer protecting the filters CF-B, CF-G, and CF-R. The buffer layer BFL may be an inorganic material layer containing at least one inorganic material from among silicon nitride, silicon oxide, and silicon oxynitride. The buffer layer BFL may be formed of a single layer or a plurality of layers.

In an embodiment, the first color filter CF-B of the color filter layer CFL is illustrated to overlap the second filter CF-G and the third filter CF-R, but the present disclosure is not limited thereto. In some embodiments, the first to third filters CF-B, CF-G and CF-R may be separated by the light blocking unit BM and may not overlap one another. Meanwhile, in an embodiment, each of the first to third filters CF-B, CF-G and CF-R may be disposed correspondingly to each of the blue light emitting area PXA-B, the green light emitting area PXA-G, and the red light emitting area PXA-R.

In one or more embodiments, unlike the one illustrated in FIG. 2, the display device DD of an embodiment may include a polarizing layer as a light control layer PP instead of the color filter layer CFL. The polarizing layer may block external light provided to the display panel DP from the outside. The polarizing layer may block some of the external light.

In addition, the polarizing layer may reduce reflected light generated in the display panel DP by external light. For example, the polarizing layer may function to block reflected light in a case where light provided from the outside of the display device DD is incident to the display panel DP and exits again. The polarizing layer may be a circularly polarizer having a reflection preventing or reducing function or the polarizing layer may include a linear polarizer and a λ/4 phase retarder. In one or more embodiments, the polarizing layer may be disposed on the base layer BL to be exposed or the polarizing layer may be disposed under the base layer BL.

Figure 3:
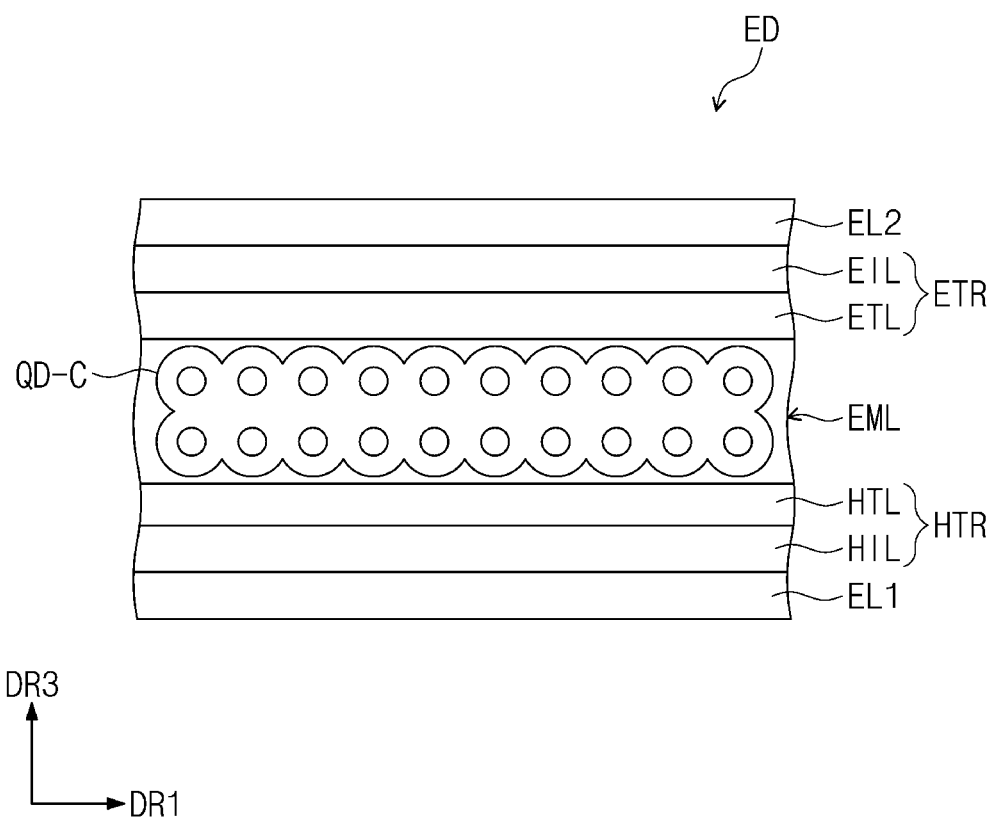
FIG. 3 is a cross-sectional view schematically illustrating a light emitting element (e.g., light emitting diode) according to an embodiment of the present disclosure.

FIG. 3 is a cross-sectional view schematically illustrating a light emitting element (e.g., light emitting diode) ED according to an embodiment of the present disclosure.

Referring to FIG. 3, the light emitting element (e.g., light emitting diode) ED according to an embodiment includes a first electrode EL1, a second electrode EL2 facing the first electrode EL1, and a plurality of functional layers disposed between the first electrode EL1 and the second electrode EL2 and including an emission layer EML.

The plurality of functional layers may include a hole transport region HTR disposed between the first electrode EL1 and the emission layer EML, and an electron transport region ETR disposed between the emission layer EML and the second electrode EL2.

The hole transport region HTR and the electron transport region ETR each may include a plurality of sub functional layers. For example, the hole transport region HTR may include a hole injection layer HIL and a hole transport layer HTL as a sub functional layer, and the electron transport region ETR may include an electron injection layer EIL and an electron transport layer ETL as a sub functional layer. Meanwhile, the present disclosure is not limited thereto, and the hole transport region HTR may further include an electron blocking layer as a sub functional layer, and the electron transport region ETR may further include a hole blocking layer as a sub functional layer.

In the light emitting element (e.g., light emitting diode) ED according to an embodiment, the first electrode EL1 has electrical conductivity. The first electrode EL1 may be formed of a metal alloy or a conductive compound. The first electrode EL1 may be an anode or a cathode. However, the present disclosure is not limited thereto.

In some embodiments, the first electrode EL1 may be a pixel electrode. The first electrode EL1 may be a transmissive electrode, a transflective electrode, or a reflective electrode. When the first electrode EU is the transmissive electrode, the first electrode EL1 may include a transparent metal oxide such as indium tin oxide (ITO), indium zinc oxide (IZO), zinc oxide (ZnO), and/or indium tin zinc oxide (ITZO). When the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (e.g., a mixture of Ag and Mg). In some embodiments, the first electrode EL1 may have a multilayer structure including a reflective film or a transflective film formed of the above-described materials, and a transparent conductive film formed of indium tin oxide (ITO), indium zinc oxide (IZO), zinc oxide (ZnO), indium tin zinc oxide (ITZO), etc. For example, the first electrode EL1 may have a three-layer structure of ITO/Ag/ITO, but the present disclosure is not limited thereto. The first electrode EL1 may have a thickness of about 700 Å to about 10000 Å. For example, the first electrode EL1 may have a thickness of 1000 Å to about 3000 Å.

The hole transport region HTR is provided on the first electrode EL1. The hole transport region HTR may include a hole injection layer HIL, a hole transport layer HTL, etc. In addition, the hole transport region HTR may further include at least one of a hole buffer layer or an electron blocking layer in addition to the hole injection layer HIL and the hole transport layer HTL. The hole buffer layer may compensate a resonance distance according to the wavelength of light emitted from the emission layer EML, and may thus increase luminous efficiency. Materials which may be included in the hole transport region HTR may be utilized as materials included in the hole buffer layer. The electron blocking layer is a layer that serves to prevent or substantially prevent electrons from being injected from the electron transport region ETR to the hole transport region HTR.

The hole transport region HTR may have a single layer formed of a single material, a single layer formed of a plurality of different materials, or a multilayer structure having a plurality of layers formed of a plurality of different materials. For example, the hole transport region HTR may have a single-layer structure formed of a plurality of different materials, or a structure in which a hole injection layer HIL/hole transport layer HTL, a hole injection layer H IL/hole transport layer HTL/hole buffer layer, a hole injection layer HIL/hole buffer layer, a hole transport layer HTL/hole buffer layer, or a hole injection layer HIL/hole transport layer HTL/electron blocking layer are stacked in the respective stated order from the first electrode EU, but the present disclosure is not limited thereto.

The hole transport region HTR may be formed utilizing various suitable methods such as a vacuum deposition method, a spin coating method, a cast method, a Langmuir-Blodgett (LB) method, an inkjet printing method, a laser printing method, and/or a laser induced thermal imaging (LITI) method.

The hole transport region HTR may include organic materials. For example, the hole transport region HTR may include, as an organic material, any one from among carbazole-based derivatives such as N-phenyl carbazole and/or polyvinyl carbazole, fluorine-based derivatives, N,N'-bis(3-methylphenyl)-N,N'-diphenyl-[1,1-biphenyl]-4,4'-diamine (TPD), triphenylamine-based derivatives such as 4,4',4"-tris (N-carbazolyl)triphenylamine (TCTA), N,N'-di(1-naphthalene-1-yl)-N,N'-diphenyl-benzidine (NPB), 4,4'-cyclohexylidene bis[N,N-bis(4-methylphenyl]benzenamine (TAPC), 4,4'-bis[N,N'-(3-tolypamino]-3,3'-dimethylbiphenyl (HMTPD), 1,3-bis(N-carbazolyl)benzene (mCP), etc. However, the present disclosure is not limited thereto.

In addition, the hole transport region HTR may further include any one from among a phthalocyanine compound such as copper phthalocyanine, N,N'-diphenyl-N,N'-bis-[4-(phenyl-m-tolyl-amino)-phenyl]-biphenyl-4,4'-diamine (DNTPD), 4,4',4"-(tris(3-methylphenylphenylamino)triphenylamine) (m-MTDATA), 4,4',4"-tris(N,N-diphenylamino) triphenylamine (TDATA), 4,4',4"-tris(N,-(2-naphthyl) -N-phenylamino)-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), triphenylamine-containing polyetherketone (TPAPEK), 4-isopropyl-4'-methyldiphenyliodonium tetrakis(pentafluorophenyl)borate, dipyrazino[2,3-f: 2',3'-h]quinoxaline-2,3,6,7,10,11-hexacarbonitrile (HAT-CN), etc. However, the present disclosure is not limited thereto.

The hole transport region HTR may have a thickness of about 100 Å to about 10000 Å, for example, about 100 Å to about 5000 Å. The hole injection layer HIL, for example, may have a thickness of about 30 Å to about 1000 Å, and the hole transport layer HTL may have a thickness of about 30 Å to about 1000 Å. For example, the electron blocking layer EBL may have a thickness of about 10 | to about 1000 Å. When the thicknesses of the hole transport region HTR, the hole injection layer HIL, the hole transport layer HTL, and the electron blocking layer EBL satisfy the above-described respective ranges, satisfactory hole transport properties may be obtained without a substantial increase in driving voltage.

The emission layer EML is provided on the hole transport region HTR. In the light emitting element (e.g., light emitting diode) ED according to an embodiment, the emission layer EML may be formed from a quantum dot composition containing a plurality of quantum dots. The emission layer EML may include a quantum dot complex QD-C.

In the light emitting element (e.g., light emitting diode) ED according to an embodiment, the emission layer EML may include a host and a dopant. In an embodiment, the emission layer EML may include the quantum dot complex QD-C as a dopant material. In addition, in an embodiment, the emission layer EML may further include a host material. In one or more embodiments, in the light emitting element (e.g., light emitting diode) ED according to an embodiment, the emission layer EML may emit fluorescence. For example, the quantum dot complex QD-C may be utilized as a fluorescent dopant material.

The emission layer EML may have, for example, a thickness of about 5 nm to about 20 nm or about 10 nm to about 20 nm.

The emission layer EML may be formed utilizing various suitable methods such as a vacuum deposition method, a spin coating method, a cast method, a Langmuir-Blodgett (LB) method, an inkjet printing method, a laser printing method, and/or a laser induced thermal imaging (LITI) method. For example, the emission layer EML may be formed by providing the quantum dot composition of an embodiment through inkjet printing.

In the light emitting element (e.g., light emitting diode) ED of an embodiment, the electron transport region ETR is provided on the emission layer EML. The electron transport region ETR may include at least one from among a hole blocking layer, an electron transport layer ETL, and an electron injection layer EIL, but the present disclosure is not limited thereto.

The electron transport region ETR may have a single layer formed of a single material, a single layer formed of a plurality of different materials, or a multilayer structure having a plurality of layers formed of a plurality of different materials.

For example, the electron transport region ETR may have a single layer structure of an electron injection layer EIL or an electron transport layer ETL, and may have a single layer structure formed of an electron injection material and an electron transport material. In some embodiments, the electron transport region ETR may have a single layer structure formed of a plurality of different materials, or may have a structure in which an electron transport layer ETL/electron injection layer EIL, or a hole blocking layer/electron transport layer ETL/electron injection layer EIL are stacked in the respective stated order from the emission layer EML, but the present disclosure is not limited thereto. The electron transport region ETR may have a thickness of, for example, about 200 Å to about 1500 Å.

The electron transport region ETR may be formed utilizing various suitable methods such as a vacuum deposition method, a spin coating method, a cast method, a Langmuir-Blodgett (LB) method, an inkjet printing method, a laser printing method, a laser induced thermal imaging (LITI) method, etc.

The electron transport region ETR may further include inorganic materials. In addition, the electron transport region ETR may include at least one from among halogenated metals, lanthanide metals, co-deposition materials of a halogenated metal and a lanthanide metal. In some embodiments, the halogenated metal may be an alkali metal halide. For example, the electron transport region ETR may include LiF, lithium quinolate (Liq), $Li_2O$, BaO, NaCl, CsF, Yb, RbCl, Rbl, Kl, and/or Kl: Yb, but the present disclosure is limited thereto.

The electron transport region ETR may further include a mixture material of an electron transport material and an insulating organo-metal salt. For example, the organo-metal salt may include, one or more metal acetates, metal benzoates, metal acetoacetates, metal acetylacetonates, and/or metal stearates.

The electron transport region ETR may include an anthracene-based compound. However, the present disclosure is not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1, O8)-(1,1-biphenyl-4-olato) aluminum (BAlq), berylliumbis(benzoquinolin-10-olate ($Bebq_2$), 9,10-di(naphthalene-2-yl)anthracene (ADN), or a mixture thereof.

The electron transport layer ETL may have a thickness of about 100 Å to about 1000 Å, for example, about 150 Å to about 500 Å. When the thickness of the electron transport layer ETL satisfies the above-described ranges, satisfactory electron transport properties may be obtained without a substantial increase in driving voltage.

When the electron transport region ETR includes the electron injection layer EIL, the electron injection layer EIL of the electron transport region ETR may have a thickness of about 1 Å to about 100 Å, for example, about 3 Å to about 90 Å. When the thickness of the electron injection layers EIL satisfies the above-described ranges, satisfactory electron injection properties may be obtained without a substantial increase in driving voltage.

The second electrode EL2 is provided on the electron transport region ETR.

The second electrode EL2 may be a common electrode. The second electrode EL2 may be a cathode or an anode, but the present disclosure is not limited thereto. In some embodiments, when the first electrode EL1 is an anode, the second electrode EL2 may be a cathode, and when the first electrode EU is a cathode, the second electrode EL2 may be an anode.

The second electrode EL2 may be a transmissive electrode, a transflective electrode, or a reflective electrode. When the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/AI, Mo, Ti, Yb, W, a compound thereof, or a mixture thereof (e.g., AgMg, AgYb, or MgAg). In some embodiments, the second electrode EL2 may have a multi-layer structure including a reflective film or a transflective film formed of the above-described materials, and a transparent conductive film formed of indium tin oxide (ITO), indium zinc oxide (IZO), zinc oxide (ZnO), indium tin zinc oxide (ITZO), etc. For example, the second electrode EL2 may include the above-described metal material(s), a combination of two or more metal materials selected from the above-described metal materials, and/or one or more oxides of the above-described metal materials.

In some embodiments, the second electrode EL2 may be connected with an auxiliary electrode. When the second electrode EL2 is connected with the auxiliary electrode, the electrical resistance of the second electrode EL2 may decrease.

Figure 4A:
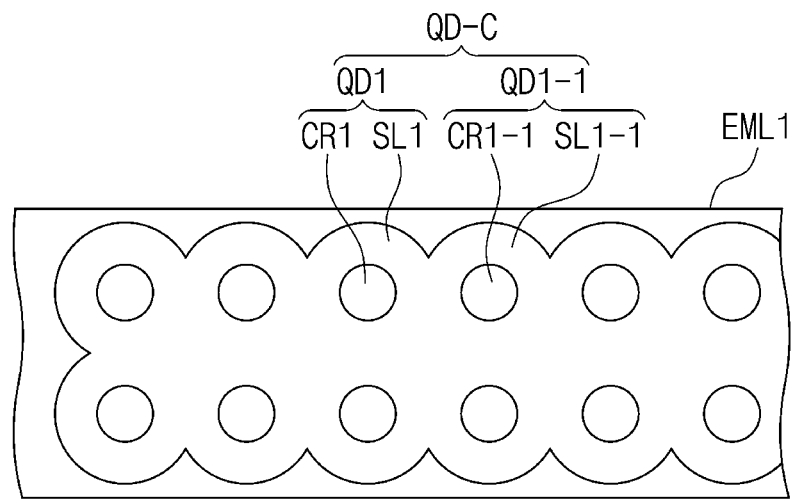
FIG. 4A is a cross-sectional view illustrating an emission layer according to an embodiment.
Figure 4B:
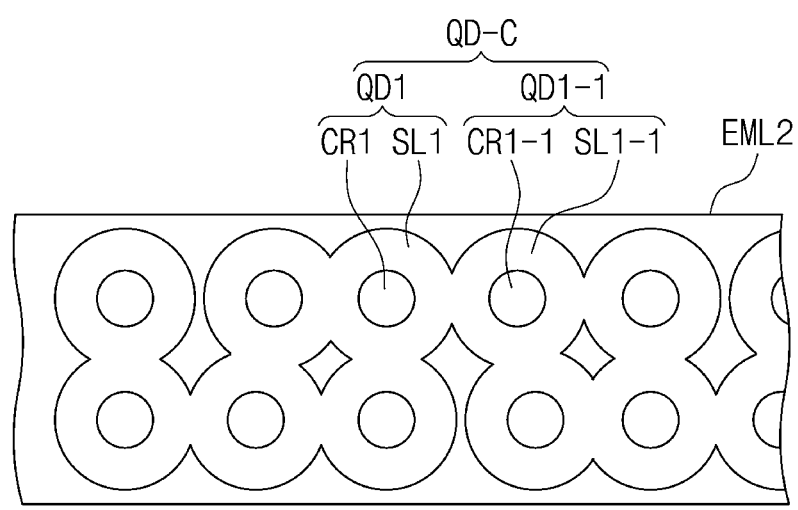
FIG. 4B is a cross-sectional view illustrating an emission layer according to an embodiment.

FIG. 4A is a cross-sectional view illustrating an emission layer EML1 included in a light emitting element (e.g., light emitting diode) ED according to an embodiment in more detail. FIG. 4B is a cross-sectional view illustrating an emission layer EML2 according to another embodiment.

The emission layers EML1 and EML2 may each include a plurality of quantum dots QD1 and QD1-1. FIGS. 4A and 4B illustrate that the quantum dots QD1 and QD1-1 may be formed as two layers as an example, but the present disclosure is not limited thereto. For example, the arrangement of the quantum dots QD1 and QD1-1 may vary according to the thickness of emission layers EML1 and EML2, the shape of the quantum dots QD1 and QD1-1 included in the emission layers EML1 and EML2, and the average diameter of the quantum dots QD1 and QD1-1.

The plurality of quantum dots QD1 and QD1-1 included in the same emission layer EML1 may include the same structure and the same material. However, for emitting light of a desired wavelength, the quantum dots QD1 and QD1-1 may include different structures and/or materials. Hereinafter, for the plurality of quantum dots QD1 and QD1-1, an arbitrary quantum dot QD1 will be described as an example.

The quantum dot QD1 may include a core CR1 and a shell SL1 around (e.g., surrounding) the core CR1. However, the present disclosure is not limited thereto. The shell SL1 may serve as a protection layer to prevent or reduce the chemical deformation of the core CR1 so as to maintain (e.g., keep) semiconductor properties, and/or serve as a charging layer to impart electrophoresis properties to the quantum dot QD1. The shell SL1 may be a single layer or multiple layers. An interface between the core CR1 and the shell SL1 may have a concentration gradient in which the concentration of an element present in the shell SL1 becomes lower towards the center of the core.

The shell SL1 may include semiconductor compounds. For example, the shell SL1 may contain at least any one from among CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and AlSb. In some embodiments, the shell SL1 may include at least one from among CdS, CdSe, CdTe, ZnS, ZnSe, and ZnTe.

In addition, the shell SL1 may further include a metal oxide and/or a non-metal oxide, for example, a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO, and/or a ternary compound such as $MgAl_2O_4$, $CoFe_2O_4$, $NiFe_2O_4$, and/or $CoMn_2O_4$. However, the present disclosure is not limited thereto.

The core CR1 of the quantum dot QD1 may be selected from a Group II-VI compound, a Group III-VI compound, a Group I-III-VI compound, a Group III-V compound, a Group III-II-V compound, a Group IV-VI compound, a Group IV element, a Group IV compound, and a combination thereof.

The Group II-VI compound may be selected from the group consisting of a binary compound selected from the group consisting of CdSe, CdTe, CdS, ZnS, ZnSe, ZnTe, ZnO, HgS, HgSe, HgTe, MgSe, MgS, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-VI compound may include a binary compound such as $In_2S_3$ and/or $In_2Se_3$, a ternary compound such as $InGaS_3$ and/or $InGaSe_3$, or any combination thereof.

The Group I-III-VI compound may include a ternary compound selected from the group consisting of AgInS, $AgInS_2$, CuInS, $CuInS_2$, $AgGaS_2$, $CuGaS_2$, $CuGaO_2$, $AgGaO_2$, $AgAlO_2$, and any mixture thereof, and/or a quaternary compound such as $AgInGaS_2$ and/or $CuInGaS_2$.

The Group III-V compound may be selected from the group consisting of a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. In one or more embodiments, the Group III-V compound may further include a Group II metal. For example, InZnP, InGaZnP, InAlZnP, etc. may be selected as a Group III-II-V compound.

The Group IV-VI compound may be selected from the group consisting of a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof.

The Group IV element may be selected from the group consisting of Si, Ge, and a mixture thereof. The Group IV compound may be a binary compound selected from the group consisting of SiC, SiGe, and a mixture thereof.

In this case, the binary compound, the ternary compound, and/or the quaternary compound may be present in particles in a uniform concentration distribution, or may be present in the same particles in a partially different concentration distribution (e.g., nonuniformly).

The quantum dot QD1 may have a full width of half maximum (FWHM) of a light emission wavelength spectrum of about 45 nm or less, for example, about 40 nm or less, or about 30 nm or less, and color purity and/or color reproducibility may be enhanced when the full width of half maximum (FWHM) of the light emission wavelength spectrum is in the above ranges. In addition, light emitted through the quantum dot QD1 may be emitted in all directions, and thus a wide viewing angle may be improved.

In addition, the form of the quantum dot QD1 is not particularly limited as long as it is a form commonly utilized in the art, and for example, a quantum dot in the form of spherical, pyramidal, multi-arm, or cubic nanoparticles, nanotubes, nanowires, nanofibers, nanoplatelets, etc. may be utilized.

The quantum dot QD1 may control the color of emitted light according to the particle size thereof, and thus the quantum dot QD1 may have various suitable light emitting colors such as blue, red, green, etc.

In the emission layer EML1 according to an embodiment, the plurality of quantum dots QD1 and QD1-1 may be connected to each other to form a quantum dot complex QD-C. In some embodiments, when energy is provided to the emission layer EML1 to make the shell SL1 of the quantum dot QD1 slightly melted (or softened), the slightly melted shell SL1 may be combined with at least one neighboring shell SL1-1 to form a quantum dot complex QD-C.

In an embodiment, referring to FIG. 4A, shells SL1 and SL1-1 of the quantum dots QD1 and QD1-1 included in the emission layer EML1 are combined with shells SL1 and SL1-1 of all neighboring quantum dots QD1 and QD1-1 to form one quantum dot complex QD-C layer. That is, in FIG. 4A, the shells SL1 and SL1-1 of all the neighboring quantum dots are combined together. In a case where the quantum dots QD1 and QD1-1 form a single layer, when a composition for forming an electron transport region ETR (FIG. 3) is applied onto the emission layer EML1 in manufacturing a light emitting element (e.g., light emitting diode), the composition for forming the electron transport region ETR (FIG. 3) may be prevented or substantially prevented from penetrating into the emission layer EML1, and accordingly, deterioration of device characteristics due to current leakage may be prevented or reduced. However, the present disclosure is not limited thereto, and in another embodiment, as illustrated in FIG. 4B, the shell SL1 of the quantum dots QD1 included in the emission layer EML2 is combined with the shell SL1-1 of the neighboring quantum dot QD1-1. That is, in FIG. 4B, some portions of the shells SL1 and SL1-1 of the quantum dots QD1 and QD1-1 are not combined with the shells SL1 and SL1-1 of neighboring quantum dots.

When the quantum dots QD1 and QD1-1 included in the emission layer EML1 form a bond between the shells SL1 and SL1-1, the combined shell of the quantum dot complex QD-C has a greater thickness than the shell SL1 of the single quantum dot QD1. For example, the shell SL1 of the quantum dot QD1 may have a thickness of about 1 nm to about 10 nm, and the combined shell of the quantum dot complex QD-C may have a thickness of about 2 nm to about 20 nm. Here, the thickness of the shell SL1 of the quantum dot QD1 may refer to the shortest distance from a surface of the core CR1 to a surface of the shell SL1. The thickness of the combined shell of the quantum dot complex QD-C may refer to the shortest distance from a surface of the core CR1 of one quantum dot QD1 to a surface of the core CR1-1 of the (e.g., neighboring) quantum dot QD1-1 in the combined structure.

In addition, when the quantum dots QD1 and QD1-1 included in the emission layer EML1 form a bond between the shells SL1 and SL1-1, dangling bond of the quantum dots QD1 decreases. Further, the distance between the neighboring quantum dots QD1 and QD1-1 becomes shorter, so that the film density of the emission layer EML1 may be improved.

Figure 5:
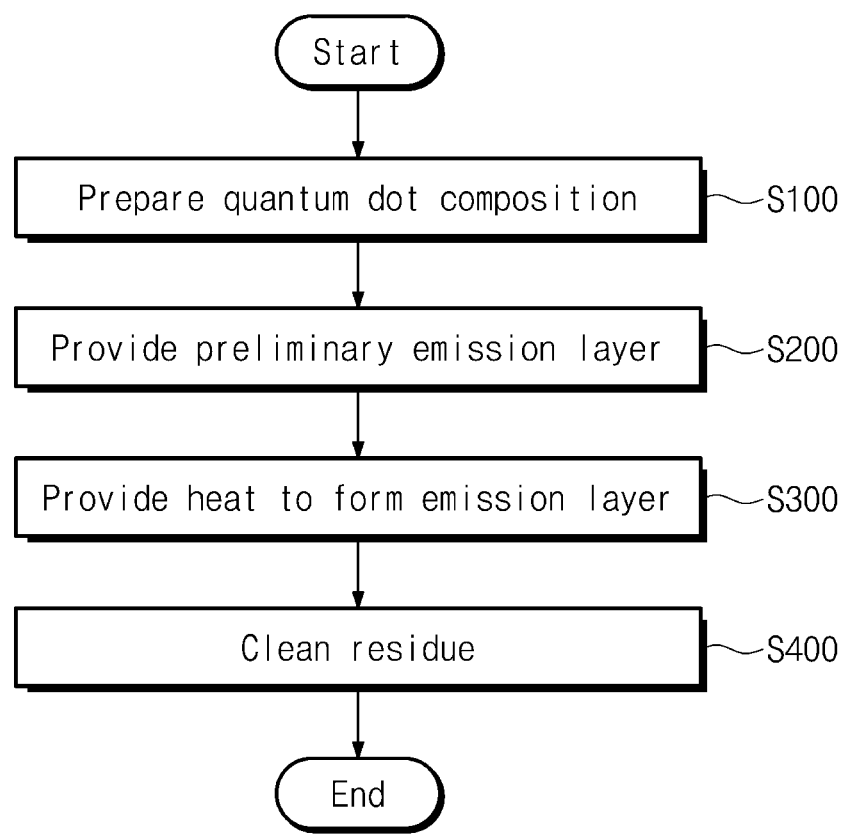
FIG. 5 is a flowchart illustrating a method of manufacturing a light emitting element (e.g., light emitting diode) according to an embodiment.
Figure 6:
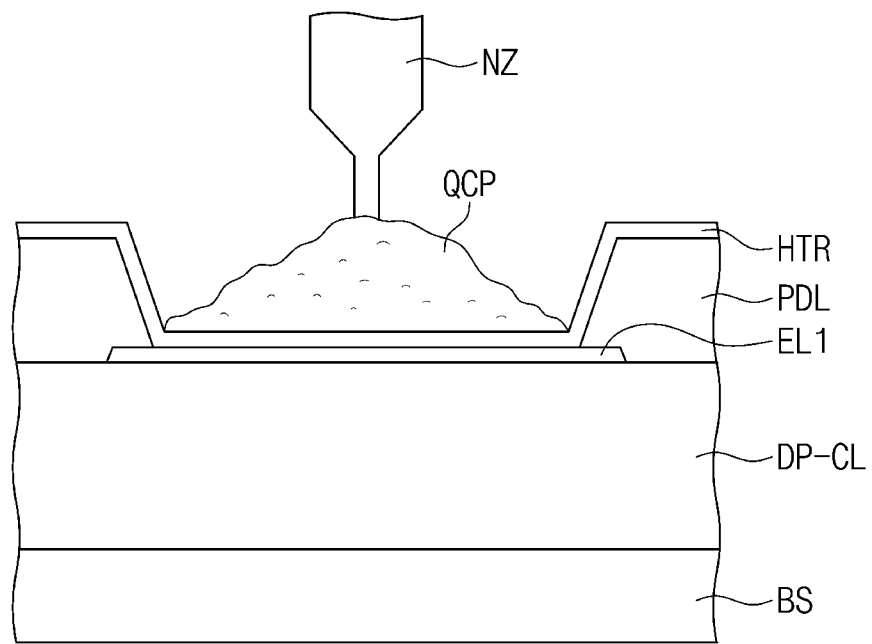
FIG. 6 is a cross-sectional view schematically illustrating forming an emission layer in a method of manufacturing a light emitting element (e.g., light emitting diode) according to an embodiment.
Figure 7:
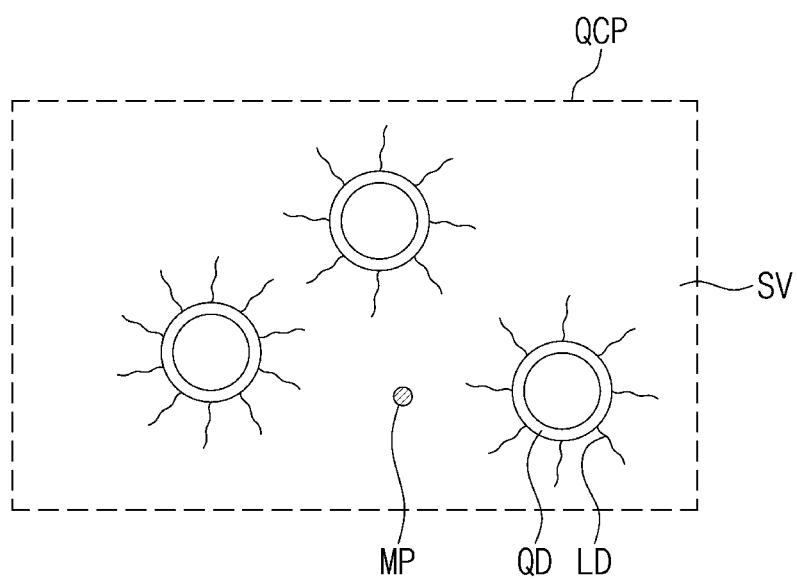
FIG. 7 is a cross-sectional view illustrating a portion of a quantum dot composition provided in FIG. 6 in more detail.
Figure 8:
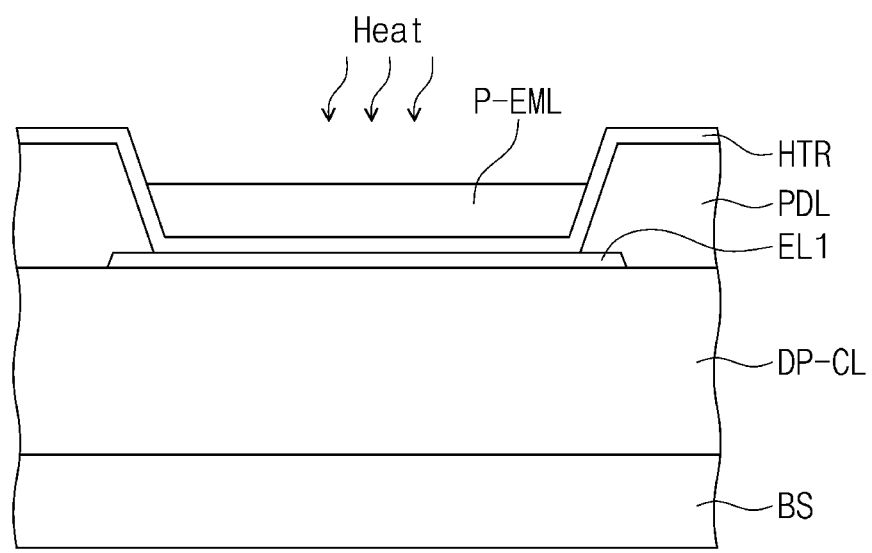
FIG. 8 is a schematic view illustrating a part of a method of manufacturing a light emitting element (e.g., light emitting diode) according to an embodiment.

FIG. 5 is a flowchart illustrating forming an emission layer EML in a method of manufacturing a light emitting element (e.g., light emitting diode) ED according to an embodiment. FIG. 6 schematically illustrates providing a preliminary emission layer P-EML (S200) in a method of forming an emission layer EML according to an embodiment. FIG. 7 is a view illustrating a portion of a quantum dot composition QCP provided in FIG. 6 in more detail. FIG. 8 is a view schematically illustrating providing energy to the preliminary emission layer P-EML to form an emission layer EML (S300).

A method of manufacturing a light emitting element (e.g., light emitting diode) according to an embodiment includes forming a first electrode EL1, forming a hole transport region HTR on the first electrode EL1, forming an emission layer EML on the hole transport region HTR, forming an electron transport region ETR on the emission layer EML, and forming a second electrode EL2 on the electron transport region ETR.

In an embodiment, the forming of the emission layer EML includes preparing a quantum dot composition (S100), providing a preliminary emission layer (S200), and providing heat to form an emission layer (S300).

The providing of the preliminary emission layer (S200) may refer to providing a quantum dot composition QCP on the hole transport region HTR. The quantum dot composition QCP may be provided between a pixel defining layer PDL through a nozzle NZ. Meanwhile, in FIG. 6, the hole transport region HTR is illustrated to be provided as a common layer so as to overlap the pixel defining film PDL, but the present disclosure is not limited thereto, and the hole transport region HTR may be provided between the pixel defining film PDL. For example, the hole transport region HTR may be provided between the pixel defining film PDL, utilizing an inkjet printing method.

Referring to FIG. 7, the providing of the quantum dot composition QCP according to an embodiment may refer to dispersing quantum dots QD in an organic solvent SV. In some embodiments, before the dispersing of the quantum dots QD in the organic solvent SV, binding (e.g., bonding) ligands LD to the quantum dots QD may be further included. When the ligands LD are bonded to surfaces of the quantum dots QD, the quantum dots QD may have increased dispersibility in the organic solvent SV. However, the present disclosure is not limited thereto and the quantum dots QD may be dispersed in the organic solvent SV without the binding of the ligands LD to the quantum dots QD.

In an embodiment, the organic solvent SV may include hexane, toluene, chloroform, dimethyl sulfoxide, cyclohexylbenzene, hexadecane, and/or dimethyl formamide. However, the present disclosure is not limited thereto.

In an embodiment, the quantum dot composition QCP may further include low melting point particles MP. The low melting point particles MP may include a material having a low melting point, and for example, the low melting point particles MP may include a metal and/or an alloy having a melting point of 1300° C. or less. In some embodiments, the low melting point particles MP may include a metal and/or an alloy having a melting point of 800° C. or less. In the case where the low melting point particles MP are included in the quantum dot composition QCP, when inducing the bonding between the shells SL of the quantum dots QD, reaction may be performed at a lower temperature. That is, the forming of the emission layer EML may be performed through a low temperature process. In addition, materials constituting other layers, such as the base substrate BS, the pixel defining layer PDL, etc. of the light emitting element (e.g., light emitting diode) ED may be selected from a broader variety.

The low melting point particles MP are not particularly limited as long as the low melting point particles MP include a metal and/or an alloy having a melting point of 1300° C. or less, and in some embodiments, the low melting point particles MP may include at least one from among aluminum (Al), magnesium (Mg), zinc (Zn), tin (Sn), manganese (Mn), copper (Cu), and an alloy thereof.

The low melting point particles MP are not removed even after the emission layer EML is formed, and are included as doped (e.g., as a dopant) in the emission layer EML, and thus may be included in an amount that does not deteriorate the characteristics of the emission layer EML. For example, the low melting point particles MP and the quantum dots QD may have a weight ratio of about 1:200 to about 1:20. Each of the low melting point particles MP may have a size of 1 μm or less. In some embodiments, each of the low melting point particles MP may have a size of 100 nm or less.

Referring to FIG. 8, after the preliminary emission layer P-EML is formed, energy is provided to the preliminary emission layer P-EML to form an emission layer EML. In this process, the shells SL of the quantum dots QD may be combined with each other to form a quantum dot complex QD-C. Accordingly, energy provided to the preliminary emission layer P-EML may be provided to form a bond (e.g., bonds) between the shells SL. The quantum dots QD have a nano size, and the quantum dots QD may have lower melting points as compared to when materials included in the shells SL have a bulk (e.g., larger) size. In addition, the preliminary emission layer P-EML may further include more low melting point particles MP to further lower the melting points. Accordingly, energy allowing the preliminary emission layer P-EML to have a temperature that reaches about 30% to about 80% of the melting point of the shells SL may be provided. In FIG. 8, the kind (e.g., type) of energy provided to the preliminary emission layer P-EML is illustrated as heat, but the present disclosure is not limited thereto, and for example, light may be provided.

In one or more embodiments, when the ligands LD are bonded to the quantum dots QD and when energy is provided to the preliminary emission layer P-EML, the ligands LD may be dissociated and removed from the quantum dots QD. However, the present disclosure is not limited thereto, and some ligands LD may be present as being bonded to the quantum dots QD.

In some embodiments, energy is provided to the preliminary emission layer P-EML to remove the organic solvent SV included in the quantum dot composition QCP. However, the present disclosure is not limited thereto, and evaporating the organic solvent SV may be further conducted thereafter.

Figure 9A:
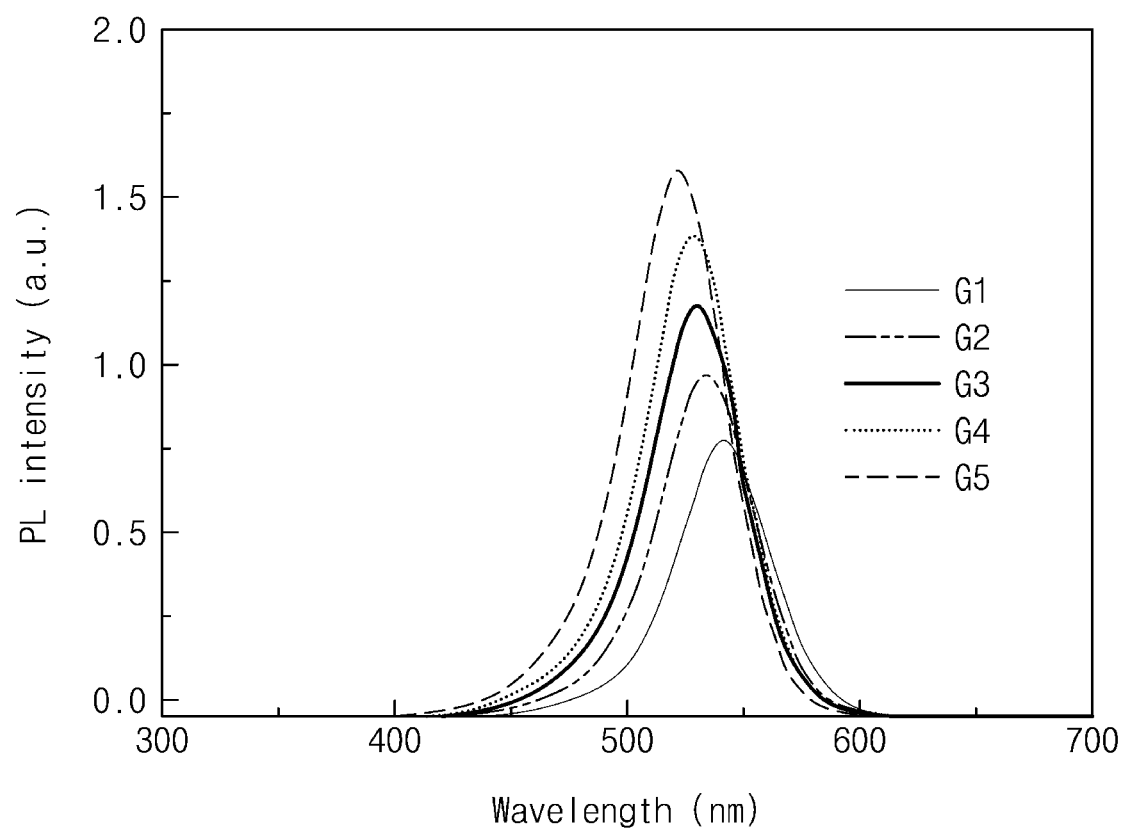
FIG. 9A is a graph showing results of analyzing luminous efficiency according to the thickness of shells.
Figure 9B:
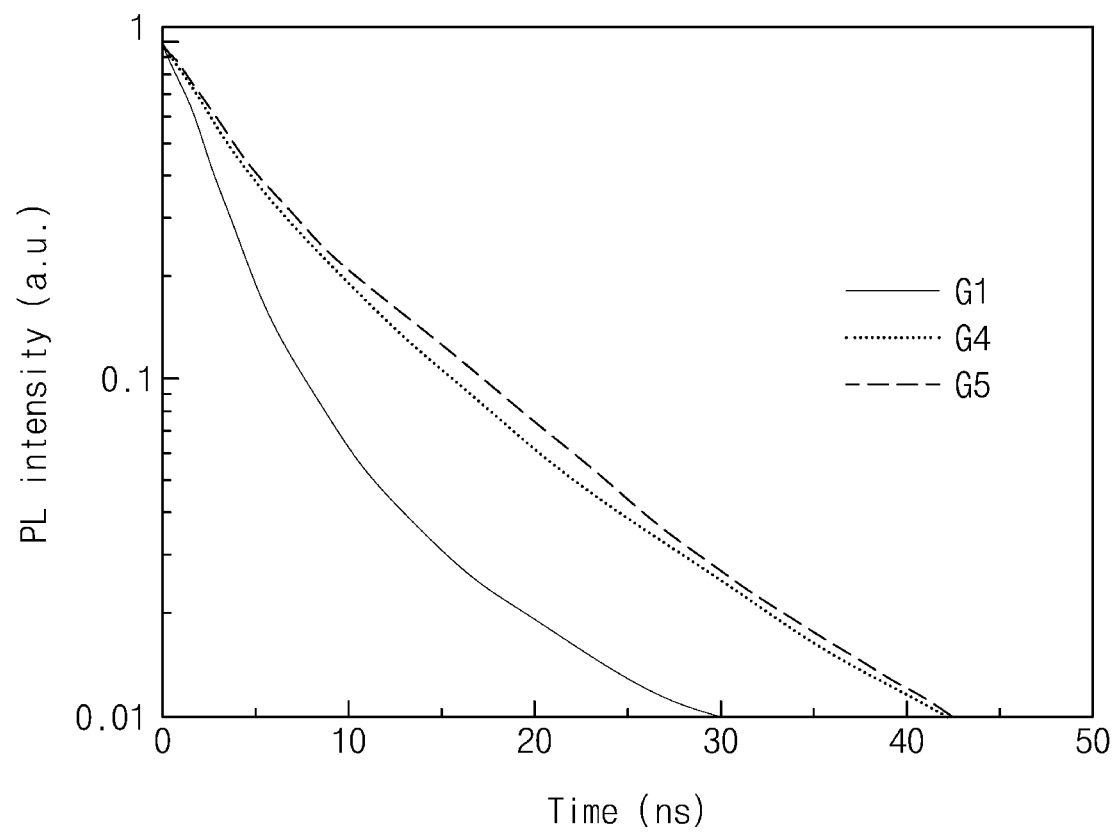
FIG. 9B is a graph showing results of analyzing lifespan according to the thickness of shells.

FIGS. 9A and 9B are graphs showing results of analyzing luminous efficiency and lifespan of a light emitting element (e.g., light emitting diode) according to the thickness of the shells. In FIGS. 9A and 9B, G1 to G5 are quantum dots having the same material and size except for the thickness of the shells, and correspond to quantum dots having a shell that increases in thickness from G1 to G5.

Referring to FIG. 9A, it is confirmed that, with an increase in thickness of the shells, luminous efficiency increases. In addition, referring to FIG. 9B, it is confirmed that with an increase in thickness of the shells, lifespan increases. Accordingly, it is expected that the light emitting element (e.g., light emitting diode) according to an embodiment of the present disclosure may achieve suitable (e.g., excellent) luminous efficiency and long life by forming a bond between neighboring shells to obtain greater thickness of the shells.

FIG. 10 is a cross-sectional view of a display device DD-1 according to another embodiment of the present disclosure. Hereinafter, in the description of the display device DD-1 of an embodiment, duplicated descriptions as one described above with reference to FIGS. 1 to 9B will not be given again, and differences will be mainly described.

Referring to FIG. 10, the display device DD-1 according to an embodiment may include a light conversion layer CCL disposed on the display panel DP-1. In addition, the display device DD-1 according to an embodiment may further include a color filter layer CFL. The color filter layer CFL may be disposed between the base layer BL and the light conversion layer CCL.

The display panel DP-1 may be a light emitting display panel. For example, the display panel DP-1 may be an organic electroluminescence display panel or a quantum dot light emitting display panel.

The display panel DP-1 may include a base substrate BS, a circuit layer DP-CL provided on the base substrate BS, and a display element layer DP-EL1.

In an embodiment, the display element layer DP-EL1 may include a light emitting element (e.g., light emitting diode) ED-a, and the light emitting element (e.g., light emitting diode) ED-a may include a first electrode EL1 and a second electrode EL2 facing each other, and a plurality of layers OL disposed between the first electrode EL1 and the second electrode EL2. The plurality of layers OL may include the hole transport region HTR (FIG. 3), the emission layer EML (FIG. 3), and the electron transport region ETR (FIG. 3). An encapsulation layer TFE may be disposed on the light emitting element (e.g., light emitting diode) ED-a.

In the light emitting element (e.g., light emitting diode) ED-a, the same description as the one described with reference to FIG. 3 may be applied to the first electrode EL1, the hole transport region HTR, the electron transport region ETR, and the second electrode EL2.

In the light emitting element (e.g., light emitting diode) ED-a included in the display panel DP-1 of an embodiment, the emission layer may include organic light emitting materials or may include the quantum dot complex described above. In the display panel DP-1 of an embodiment, the light emitting element (e.g., light emitting diode) ED-a may emit a first light. For example, the first light may be blue light.

The light conversion layer CCL may include a plurality of partition walls BK disposed spaced apart from each other and light control units CCP-G and CCP-R disposed between the partition walls BK. The partition walls BK may be formed from materials including a polymer resin and a coloring additive. The partition walls BK may be formed from materials including a light absorbing material, and/or formed from materials including a pigment and/or a dye. For example, the partition walls BK may include a black pigment and/or a black dye to implement a black partition wall. When forming the black partition wall, carbon black and/or the like may be utilized as a black pigment and/or a black dye, but the present disclosure is not limited thereto.

The light conversion layer CCL may include a light transmission unit CCP-B transmitting the first light, a first light control unit CCP-G including a fourth quantum dot complex QD-C4 converting the first light into a second light, and a second light control unit CCP-R including a fifth quantum dot complex QD-S5 converting the first light into a third light. The second light may be light of longer wavelength ranges than the first light, and the third light may be light of longer wavelength ranges than each of the first light and the second light. For example, the second light may be green light, and the third light may be red light. Regarding the quantum dots complexes QD-C4 and QD-C5 included in the light control units CCP-G and CCP-R, the same descriptions as the one for the quantum dot complex described above may be applied.

The light conversion layer CCL may further include a capping layer CPL. The capping layer CPL may be disposed on the light control units CCP-G and CCP-R, and the partition walls BK. The capping layer CPL may serve to prevent or reduce penetration of moisture and/or oxygen (hereinafter, referred to as "moisture/oxygen"). The capping layer CPL may be disposed on the light control units CCP-G and CCP-R to prevent or substantially prevent the light control units CCP-G and CCP-R from being exposed to moisture/oxygen.

In an embodiment, the capping layer CPL may be an organic layer and/or an inorganic layer. For example, when the capping layer CPL includes an inorganic material, the inorganic material may include an alkali metal compound such as LiF, an alkaline earth metal compound such as $MgF_2$, SiON, $SiN_x$, SiOy, etc.

For example, when the capping layer CPL includes an organic material, the organic material may include a-NPD, NPB, TPD, m-MTDATA, $Alq_3$ CuPc, N4,N4,N4',N4'-tetra (biphenyl-4-yl) biphenyl-4,4'-diamine (TPD15), 4,4',4"-tris (carbazol sol-9-yl)triphenylamine (TCTA), etc., and/or may include epoxy resins and/or acrylates such as methacrylates.

The display device DD-1 of an embodiment may include a color filter layer CFL disposed on the light conversion layer CCL, and the descriptions of FIG. 2 may be equally applied to the color filter layer CFL and the base layer BL.

In the method of manufacturing a light emitting element (e.g., light emitting diode) according to an embodiment of the present disclosure, when forming an emission layer, energy (e.g., specific energy) is provided to induce bonding between shells of quantum dots, and accordingly, the distance between the quantum dots in the emission layer is shortened to increase the stacking density of the quantum dots and the thickness of the shells, thereby providing improved luminous efficiency and service life. In addition, the quantum dots may have reduced dangling bond, and the emission layer may thus have improved thermal stability.

A light emitting element (e.g., light emitting diode) and a display device according to an embodiment include quantum dots in which shells of neighboring quantum dots are bonded to one another in the emission layers, and may thus exhibit improved luminous efficiency and service life.

A method of manufacturing a light emitting element (e.g., light emitting diode) according to an embodiment may provide a light emitting element (e.g., light emitting diode)

including an emission layer having suitable (e.g., excellent) stability, including bonding shells of neighboring quantum dots to each other.

Although the present disclosure has been described with reference to a preferred embodiment of the present disclosure, it will be understood that the present disclosure should not be limited to these preferred embodiments but various changes and modifications can be made by those skilled in the art without departing from the spirit and scope of the present disclosure, and equivalents thereof.

What is claimed is:

1. A light emitting diode comprising:
a first electrode;
a hole transport region on the first electrode;
an emission layer on the hole transport region and comprising a quantum dot complex;
an electron transport region on the emission layer; and
a second electrode on the electron transport region,
wherein the quantum dot complex comprises two or more quantum dots each comprising a core and a shell around the core, and
wherein, of the two or more quantum dots, a shell of one quantum dot is directly combined with a shell of at least one neighboring quantum dot without another material therebetween.

2. The light emitting diode of claim 1, wherein
the emission layer further comprises low melting point particles, and
the low melting point particles comprise a metal and/or an alloy having a melting point of 1300° C. or less.

3. The light emitting diode of claim 2, wherein the low melting point particles comprise at least one from among Al, Mg, Zn, Sn, Mn, Cu, and an alloy thereof.

4. The light emitting diode of claim 2, wherein a weight ratio of the low melting point particles to the two or more quantum dots is about 1:200 to about 1:20.

5. The light emitting diode of claim 2, wherein each of the low melting point particles has a size of 1 μm or less.

6. The light emitting diode of claim 1, wherein the shell comprises at least one from among CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and AlSb.

7. The light emitting diode of claim 1, wherein:
the hole transport region comprises an organic material; and
the electron transport region comprises an inorganic material.

8. A display device comprising:
a plurality of light emitting diodes; and
a light conversion layer on the plurality of light emitting diodes and comprising at least one light control unit comprising a quantum dot complex,
wherein the quantum dot complex comprises two or more quantum dots each comprising a core and a shell around the core, and
wherein, of the two or more quantum dots, a shell of one quantum dot is directly combined with a shell of at least one neighboring quantum dot without another material therebetween.

9. The display device of claim 8, wherein
the light emitting diodes are to emit a first color light, and
the light conversion layer comprises:
a transmission unit to transmit the first color light;
a first light control unit to convert the first color light into a second color light; and
a second light control unit to convert the first color light into a third color light.

10. The display device of claim 8, wherein
the light control unit further comprises low melting point particles, and
the low melting point particles comprise a metal and/or an alloy having a melting point of 1300° C. or less.

11. The display device of claim 10, wherein the low melting point particles comprise at least one from among Al, Mg, Zn, Sn, Mn, Cu, and an alloy thereof.

12. The display device of claim 10, wherein each of the low melting point particles has a size of 1 μm or less.

13. The display device of claim 8, wherein the shell comprises at least one from among CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and AlSb.

14. The display device of claim 9, further comprising a color filter layer on the light emitting diodes,
wherein the color filter layer comprises:
a first filter to transmit the first color light;
a second filter to transmit the second color light; and
a third filter to transmit the third color light.

* * * * *

UNITED STATES PATENT AND TRADEMARK OFFICE
CERTIFICATE OF CORRECTION

PATENT NO. : 12,108,616 B2  
APPLICATION NO. : 17/450151  
DATED : October 1, 2024  
INVENTOR(S) : Yongil Kim Page 1 of 1

It is certified that error appears in the above-identified patent and that said Letters Patent is hereby corrected as shown below:

In the Claims

In Column 21, Line 42, in Claim 6, delete "AIP," and insert -- AlP, --.

In Column 21, Line 42, in Claim 6, delete "AISb." and insert -- AlSb. --.

In Column 22, Line 38, in Claim 13, delete "AIP," and insert -- AlP, --.

In Column 22, Line 38, in Claim 13, delete "AISb." and insert -- AlSb. --.

Signed and Sealed this  
Fourth Day of February, 2025

Coke Morgan Stewart  
*Acting Director of the United States Patent and Trademark Office*